United States Patent [19]

Dattilo

[11] 4,223,368

[45] Sep. 16, 1980

[54] ELECTROSTATIC DISCHARGE PROTECTION DEVICE

[76] Inventor: Donald P. Dattilo, 2302 Taylorsville Rd., Louisville, Ky. 40205

[21] Appl. No.: 942,453

[22] Filed: Sep. 14, 1978

[51] Int. Cl.$^2$ ............................................. H05F 3/02
[52] U.S. Cl. .................................... 361/220; 206/328
[58] Field of Search .......................... 361/220, , 56, 91; 206/328, 329

[56] References Cited

U.S. PATENT DOCUMENTS

| | | | |
|---|---|---|---|
| 3,648,108 | 3/1972 | Bailey | 361/220 X |
| 3,653,498 | 4/1972 | Kisor | 206/329 |
| 3,701,079 | 10/1972 | Bowden et al. | 206/329 X |
| 3,784,957 | 1/1974 | Bailey | 361/220 X |
| 3,908,153 | 9/1975 | Cason, Jr. | 361/220 |
| 4,037,267 | 7/1977 | Kisor | 361/220 |

OTHER PUBLICATIONS

IBM Technical Disclosure Bulletin, Vol. 17, No. 10, Mar. 1975, "Protective Container for Integrated Circuit Modules."

Primary Examiner—J. D. Miller
Assistant Examiner—L. C. Schroeder
Attorney, Agent, or Firm—Diller, Ramik & Wight

[57] ABSTRACT

An electrostatic discharge protection device adapted to be clipped onto the insertion type edge connectors of a circuit card assembly. The device includes a shunt circuit for electrically short circuiting the edge connectors of the card to provide a path of low resistance between them.

10 Claims, 3 Drawing Figures

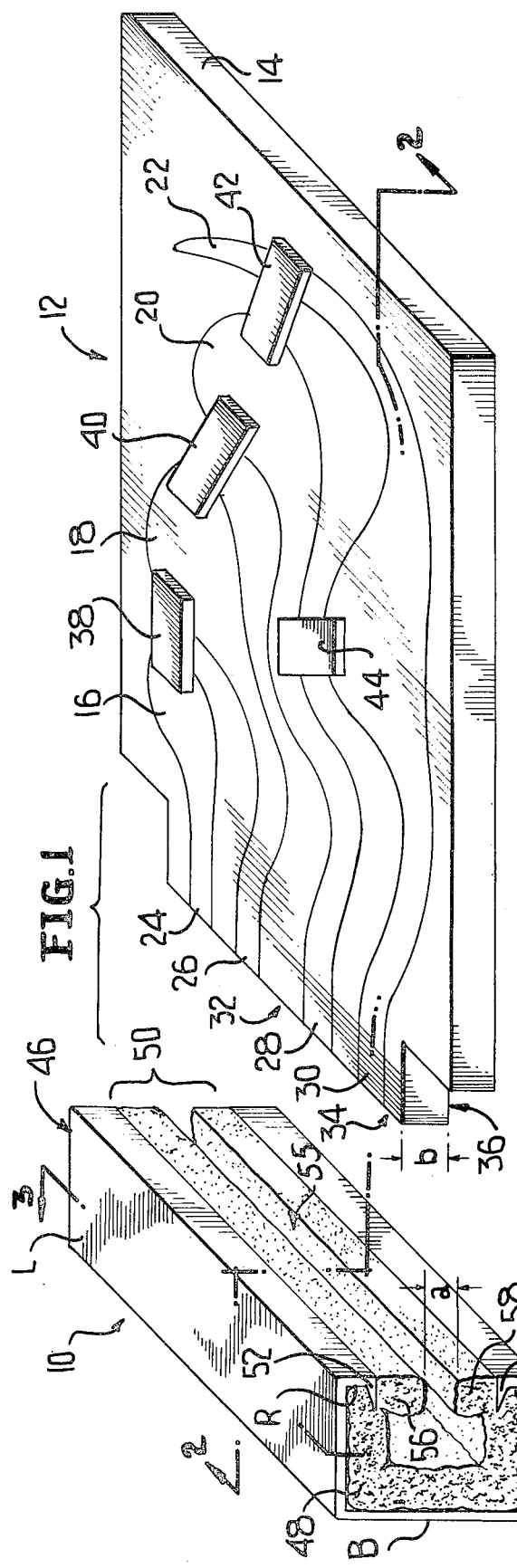
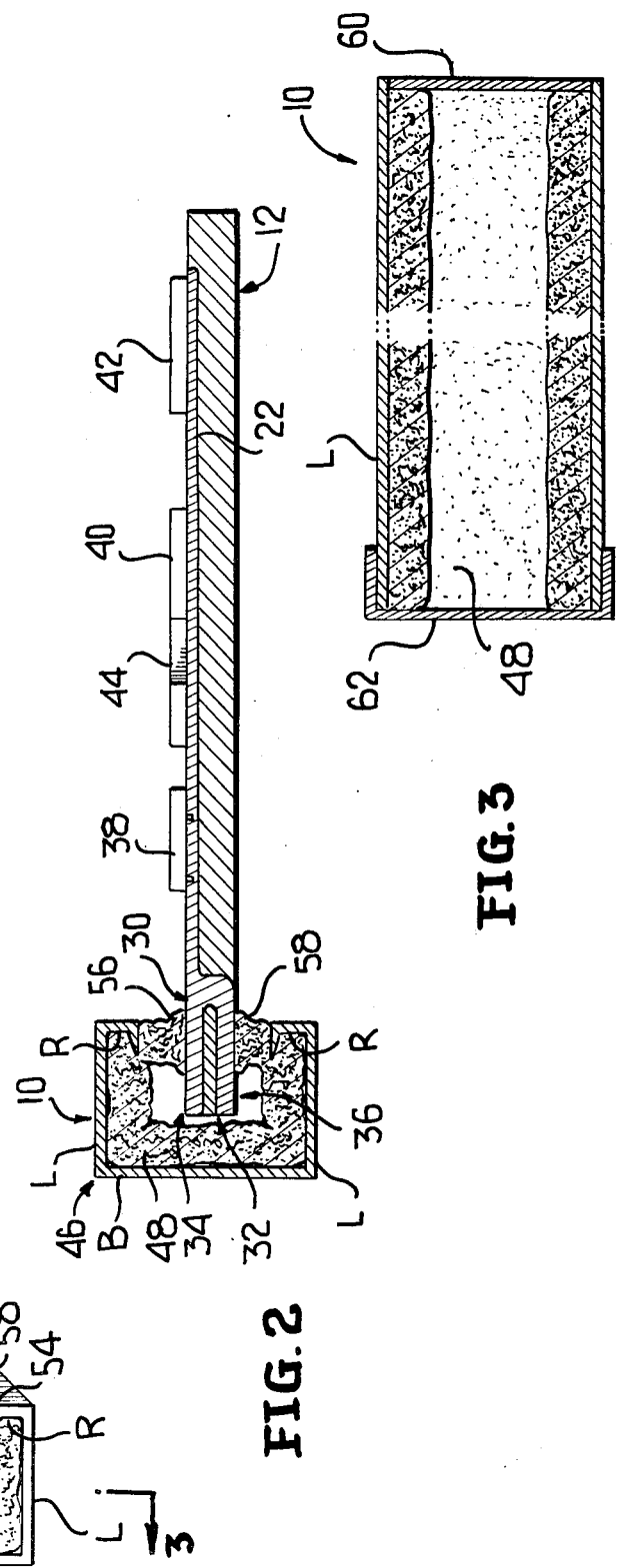
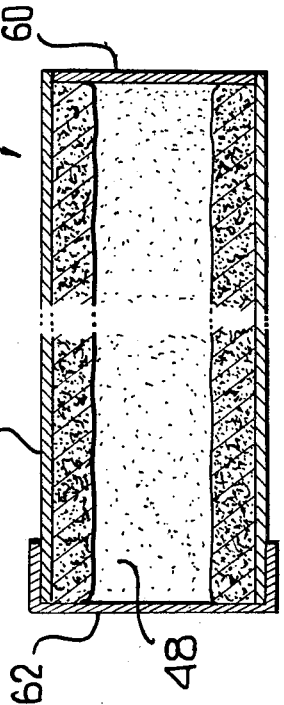
FIG.1
FIG.2
FIG.3

ELECTROSTATIC DISCHARGE PROTECTION DEVICE

BACKGROUND OF THE INVENTION

The present invention relates to devices for protecting circuit board assemblies from electrostatic discharge.

At present, the electronics industry utilizes a large variety of integrated circuits (chips) which are normally mounted on a circuit board assembly known in the art as a card. Each card usually has a multiplicity of chips mounted thereon.

These integrated circuits are delicate and can become severly damaged if they are exposed to inordinately high voltages, such as static electricity.

A major problem in the electronic industry is that upon handling, packaging or shipping the circuit cards, they become exposed to static electricity from the environment around them. This static electricity if discharged through the chips can damage them since such electrostatic discharge can often be of an inordinately high voltage.

It is common practice to shield the circuit assemblies from electrostatic discharge by enclosing them in insulative packages for shipping purposes. These packages usually are boxes which insulate the card from static electricity or bags such as the static shielding bags, type 2100, produced by the 3M company. The bags produced by 3M act not only as an insulative enclosure but they also have an electricity conductive outer layer which allows static electricity to discharge easily to ground.

However, these devices afford no protection from static discharge once they are removed from the bag.

However, these cards can be exposed to static electricity when they are removed from the shipping container and are handled by, for example, maintenance personnel when they install them. Improper handling may cause electrostatic discharge through the integrated circuits of the circuit board assembly, thus damaging or destroying them.

This electrostatic discharge from an individual can easily be of high voltage as shown in the values below reported by T. S. Speakman in "A MODEL FOR THE FAILURE OF BIPOLAR SILICON INTEGRATED CIRCUITS SUBJECT TO ELECTROSTATIC DISCHARGE", 12th Annual Proc. Reliability Physics, 1974.

|  | Most Common reading | Highest Reading |
|---|---|---|
| Person walking across carpet | 12,000 volts | 39,000 volts |
| Person walking across vinyl tile floor | 4,000 | 13,000 |
| Person working at bench | 500 | 3,000 |
| 16 Lead DIPS* in plastic box | 3,500 | 12,000 |
| 16 Lead DIPS in plastic shipping tube | 500 | 3,000 |

*Dual-In-Line Packages
Ambient Relative Humidity-15% to 36%

BRIEF SUMMARY OF THE INVENTION

The present invention is directed to a means for protecting circuit assemblies from electrostatic discharge whereby circuit cards can be safely handled.

The present invention comprises means for allowing static electricity to which a circuit card has been exposed to dissipate preferentially through a low resistance path in parallel with any integrated circuits on the card.

More particularly, a removable shunt is provided which electrically couples all of the insertion type edge connectors of the circuit card. The device is unobtrusive and is not likely to be noticed readily, thereby protecting it from premature removal. However, the card can not be inserted into a rack of female receptor without the shunt being removed.

Further, the present invention is directed to a device which is quickly and easily placed on and removed from the edge connectors of circuit assemblies.

BRIEF DESCRIPTION OF THE DRAWING FIGURES

FIG. 1 is a prospective view of the protective clip of the invention and an associated circuit card;

FIG. 2 is a section taken along line 2—2 of FIG. 1 with the clip device secured onto the circuit card; and FIG. 3 is a section taken along line 3—3 of the clip of FIG. 1 having an end cap and an end plate thereon.

DETAILED DESCRIPTION OF THE INVENTION

Referring now more particularly to FIG. 1, the device 10 of the invention is shown along with an associated circuit card 12.

The circuit card 12 consists of a circuit board 14 having a pattern of electrically conductive strips 16, 18, 20 and 22 printed or otherwise disposed on one or both sides thereof. These conductive strips 16, 18, 20 and 22 are electrically coupled to insertion type edge connectors 24, 26, 28 and 30 which are disposed along one edge 32 of the circuit card 12. The edge connectors 24, 26, 30 and 32 are disposed along at least one of the two side faces 34 and 36 of the one edge 32, depending upon whether the card is of the single or double sided type.

It is through the edge connectors 24, 26, 28 and 30 that the integrated circuits or chips 38, 40, 42 and 44 via the strips 16, 18, 20 and 22 are provided with electrical connection with the proper circuits when the card 12 is installed into the rack or female receptor of the apparatus (not shown) of which it is a part. The chips 38, 40, 42 and 44 are integrated circuits and have depending electrically conductive connectors (legs) (not shown) which are in electrical contact with the conductive strips 16, 18, 20, etc.

The electrostatic discharge protection device 10 consists of a spring-like clamping member 46 which is fashioned from a resilient material such as metal, plastic or the like and a compressible electrically conductive inner layer 48.

The clamping member 46 has a length substantially equal to the width of the one or edge 32 of its associated circuit card assembly 12 and has a mouth 50 which extends along the length of the device 10.

In the particular embodiment shown in FIG. 1 the clamping member 46 is of channel shape defined by the parallel legs L and interconnecting bight portion B. The four edges of the legs L are bent over as shown to define a pair of inwardly directed edge portions 52 and 54 which border the longitudinally extending mouth 50. These edge portions 52 and 54 by virtue of their spacing from the respective legs L define the recesses R which receive the material 48 as shown and the portions 52 and 54 function as barbs or retainers which engage the conductive layer 48 to retain it with the clamping member 46.

The conductive layer 48 is composed of a low resistance foam material which is commercially available. This foam material is manufactured in sheet form and is commonly used in the electronics industry for protecting individual integrated circuit chips from electrostatic discharge. Normally, circuit chips having DIP pin type connectors are shipped in a protective case, box, bag or the like having a piece of this foam material therein, in which the pins of the chips are embedded. This foam provides a low resistance path between and among the pins which in effect short circuits all of the DIP pins thereby preventing high voltage surges, due to electrostatic discharge, from travelling through the circuits of the chip, for these surges will tend to shunt through the low resistance path of the foam material.

In the embodiment shown in FIG. 1, the layer 48 is a portion of this foam material which has been cut to a length substantially equal to that of the clamping member 46 and to a width sufficient to be forced into place with the edge portions 52 and 54 biting thereinto, with the material overlying and substantially conforming to the shape of the interior surface of the member 46 as to overlap the edge portions 52 and 54 and define a pair of spaced parallel extending lips 56 and 58 bordering the mouth 55.

It is not essential that the entire interior of the clamping member 46 be covered by the foam material. What is essential is that the foam material, when the device is installed, be pressed against all of the edge connectors so as to make good electrical contact therewith. In order to achieve this, the foam material must be compressed and, to this end, the mouth 50 is of such width that when partially closed off by the foam material as for example by lips 56 and 58, as shown in FIG. 1, the remaining opening (or the spacing between the lips 56 and 58) has a width "a" which is significantly less than the thickness "b" of an associated circuit card 12.

In order to protect the circuit chips 38, 40, 42 and 44 of a circuit board assembly 12 from voltage surges due to static electricity, the protective device 10 is simply slipped onto the board assembly 12 as shown in FIG. 2. Here the circuit board assembly 12 is shown having the one end 32 clampingly engaged within the clamping member 46 in such fashion as to have the edge connectors (of which connector 30 is shown) frictionally engaged by the compressed foam material 48. Since the edge connectors such as connector 30 are disposed along both surfaces or sides 34 and 36 of the one end 32, the foam material 48 engages both sides of the card 12 with the lips 56 and 58. This foam material provides a low resistive or shunt path for any static electricity which may be imposed across or between the conductive strips 16, 18, 20 and 22 so that at least virtually all of the electrostatic charge will dissipate through the foam material or shunt means 48 instead of through the chips such as chip 44 coupled to that circuit.

If, the circuit card 12 shown in FIG. 2 had its edge connectors disposed along only one side face, then only one corresponding lip portion of the foam material would be required. However, the particular arrangement of FIGS. 1 and 2 is very economical in any event since the strip of foam material 48 very readily is forced into the channel of the member 46 and is efficiently retained therein by virtue of the edge portions 52 and 54. As illustrated, the foam material is prestressed by virtue of the bending thereof into substantially U-shape and additionally by the biting of the edges 52 and 54 thereinto. At the same time, this arrangement leaves the lip portions 56 and 58 virtually free from precompression. Therefore, the lip portions 56 and 58 define a space therebetween whose width is significantly less than the thickness of the circuit card, thereby assuring that the foam material is free to be compressed against the edge connectors to make good electrical contact therewith when the device is forced over the edge of the circuit board.

The electrostatic discharge devices such as device 10 can be manufactured to standard lengths which would correspond to the widths of standard circuit card assemblies or they can be manufactured to relatively long stock lengths such as for example three foot lengths. These stock lengths would then be obtained by the user who would cut off portions of the stock to suit his particular needs.

The devices such as device 10 which are manufactured to standardized lengths could also be provided with integral end plates at each end such as end plate 60 in FIG. 3 or end caps at each end such as end cap 62 (also in FIG. 3) in order to protect against accidental endwise displacement of the protective device.

What is claimed is:

1. A device for protecting a circuit board assembly, having insertion type edge connectors, disposed along at least one side edge thereof, from damage due to electrostatic discharge through the circuits of said assembly, said device comprising in combination:
   an elongate clamping member of resilient material having a longitudinal mouth co-extending therewith;
   an electrically conductive foam material disposed within said mouth along at least one edge thereof and co-extending therewith to present an opening of predetermined width;
   said device being clipped onto said one edge of said circuit assembly, which has a thickness that exceeds said predetermined width of said opening, in such alignment as to present the connectors disposed along said at least one side in frictional contact with said foam material whereby said device clampingly engages said circuit assembly and effects electrical connection between and among said edge connectors and said foam material to allow electrostatic discharge to proceed through said foam material.

2. The device as defined in claim 1 wherein said clamping member includes integral end plates sealing off each end thereof.

3. The device as defined in claim 1 wherein said clamping member includes end caps sealing off each end thereof.

4. A device for protecting a circuit board assembly, having insertion type edge connectors disposed along at least one side edge thereof, from damage due to electrostatic discharge through the circuits of said assembly, said device comprising in combination:
   an elongate clamping member of resilient material having a longitudinal mouth co-extending therewith, said mouth presenting a pair of inwardly directed opposite edge portions;
   an electrically conductive foam material disposed within said clamping member and substantially conforming to the interior shape thereof and overlapping both said opposite edge portions to present a pair of spaced parallel and longitudinally extending lips, said foam material being retained within the clamping member by said inwardly directed edge portions;

said device being clipped onto said one edge of said circuit assembly, which has a thickness that exceeds the distance between said spaced lips, whereby said device clampingly engages said circuit board and said lips effect electrical connection between and among said edge connectors and said foam material to allow electrostatic discharge to proceed through said foam material.

5. The device as defined in claim 4 wherein said clamping member includes integral end plates sealing off each end thereof.

6. The device as defined in claim 4 wherein said clamping member includes end caps sealing off each end thereof.

7. An electrostatic discharge protection device in combination with a circuit board assembly which comprises, a circuit board having a plurality of circuits disposed thereon, a plurality of integrated circuit chips electrically coupled to said circuits and insertion type edge connectors disposed along at least one side of said circuit board assembly, wherein said device comprises:

an elongate clamping member of resilient material having a longitudinal mouth co-extending therewith;

an electrically conductive foam material having a resistivity which is less than that of said circuit chips disposed within said mouth along at least one edge thereof to present an opening of predetermined width co-extending with said mouth;

said circuit board, the thickness of which exceeds the predetermined width of said opening, having said one edge thereof forced into said opening in such alingment that said foam material frictionally engages said edge connectors whereby electrical connection is effected between and among said edge connectors and said foam material thereby to allow electrostatic discharge to proceed through said foam material.

8. An electrostatic discharge protection device in combination with a circuit board assembly which comprises, a circuit board having a plurality of circuits thereon, a multiplicity of integrated circuit chips electrically coupled to said circuits and insertion type edge connectors disposed along at least one side of one edge of said circuit borad, said edge connectors being electrically coupled to said circuits of said assembly and adapted to be inserted into a power source for said assembly, wherein said device protects said integrated circuits from electrostatic discharge while said assembly is not inserted into said power source, said device comprises:

an elongate clamping member of resilient material clampingly engaging both sides of said one edge of the circuit assembly; and electrically conductive foam means disposed between said clamping member and said edge connectors and forcibly engaging the latter for electrically interconnecting all of said edge connectors whereby electrostatic discharge is allowed to proceed through said means.

9. The device as defined in claim 8 wherein said clamping member includes integral end plates sealing off each end thereof.

10. The device as defined in claim 8 wherein said clamping member includes end caps sealing off each end thereof.

* * * * *